United States Patent
Xu et al.

(10) Patent No.: US 12,057,810 B2
(45) Date of Patent: Aug. 6, 2024

(54) VOLTAGE CONTROLLED OSCILLATOR FOR FLIPPED AND COMPLEMENTARY LOW NOISE

(71) Applicant: ZHEJIANG UNIVERSITY, Zhejiang (CN)

(72) Inventors: Zhiwei Xu, Zhoushan (CN); Quanyong Li, Zhoushan (CN); Jiangbo Chen, Zhoushan (CN); Likang Du, Zhoushan (CN); Shengjie Wang, Zhoushan (CN); Chunyi Song, Zhoushan (CN)

(73) Assignee: ZHEJIANG UNIVERSITY, Zhoushan (CN)

( * ) Notice: Subject to any disclaimer, the term of this patent is extended or adjusted under 35 U.S.C. 154(b) by 0 days.

(21) Appl. No.: 18/335,102

(22) Filed: Jun. 14, 2023

(65) Prior Publication Data

US 2023/0378909 A1    Nov. 23, 2023

Related U.S. Application Data

(63) Continuation-in-part of application No. PCT/CN2022/105179, filed on Jul. 12, 2022.

(30) Foreign Application Priority Data

May 17, 2022    (CN) .......................... 202210545578.X (51) Int. Cl.
*H03B 5/12*    (2006.01)
(52) U.S. Cl.
CPC ..... *H03B 5/1212* (2013.01); *H03B 2200/004* (2013.01); *H03B 2200/0088* (2013.01)

(58) Field of Classification Search
CPC .................................................... H03B 5/1212
USPC ......................................................... 331/117 FE
See application file for complete search history.

(56) References Cited

U.S. PATENT DOCUMENTS

| | | | |
|---|---|---|---|
| 8,102,216 B1 * | 1/2012 | Kaczynski | H03B 5/1215 331/117 FE |
| 11,218,113 B1 * | 1/2022 | Bhat | H03B 5/124 |
| 2005/0046502 A1 | 3/2005 | Singh et al. | |

FOREIGN PATENT DOCUMENTS

| | | |
|---|---|---|
| CN | 101183851 A | 5/2008 |
| CN | 103078591 A | 5/2013 |
| CN | 106921345 A | 7/2017 |
| CN | 110661490 A | 1/2020 |
| CN | 111541423 A | 8/2020 |
| CN | 112234983 A | 1/2021 |
| CN | 112653456 A | 4/2021 |
| CN | 113676137 A | 11/2021 |

* cited by examiner

*Primary Examiner* — Joseph Chang
(74) *Attorney, Agent, or Firm* — METIS IP LLC (57) ABSTRACT

The present disclosure provides a voltage controlled oscillator for flipped and complementary low noise. The voltage controlled oscillator includes a first resonant cavity, a second resonant cavity, and an associated circuit. The associated circuit is configured to connect the first resonant cavity and the second resonant cavity in series and couple the first resonant cavity and the second resonant cavity. A resonant frequency of the first resonant cavity and a resonant frequency of the second resonant cavity satisfy a first preset condition.

6 Claims, 7 Drawing Sheets

VOLTAGE CONTROLLED OSCILLATOR FOR FLIPPED AND COMPLEMENTARY LOW NOISE

CROSS-REFERENCE TO RELATED APPLICATIONS

This application is a continuation-in-part of International Patent Application No. PCT/CN2022/105179, filed on Jul. 12, 2022, which claims priority to Chinese Patent Application No. 202210545578.X, filed on May 17, 2022, the entire contents of which are hereby incorporated by reference.

TECHNICAL FIELD

The present disclosure relates to the technical field of integrated circuits, in particular, to a voltage controlled oscillator for flipped and complementary low noise.

BACKGROUND

With the update and development of radar technologies, millimeter wave radar technology has gradually become a research hotspot. Voltage Controlled Oscillator (VCO), as a key circuit module in millimeter wave radar technology, still faces many challenges in its design: when an operating frequency increases to a millimeter wave frequency band, the significant decrease of quality factors (Q value) of passive components causes the deterioration of phase noise performance; complementary metal-oxide-semiconductor (CMOS) devices have inherent flicker noise, which also causes poor performance of the flicker noise of millimeter wave voltage controlled oscillators.

Furthermore, since a non-linear C-V curve of a variable capacitor causes the phase noise to be inconsistent across a tuning range, a modulated carrier wave may be performed on any noise within the voltage controlled oscillator through a voltage/frequency gain ($K_{VCO}$) of the voltage controlled oscillator, which generates additional phase noises. For radar applications (especially radars that require a large tuning range, such as FMCW radar, or the like), the voltage/frequency gain ($K_{VCO}$) of the voltage controlled oscillator is significantly large, so that the phase noise generated after tuning is more obvious, thereby affecting the performance of a voltage controlled oscillator for a millimeter wave radar.

Thus, it is desirable to provide a voltage controlled oscillator for flipped and complementary low noise, which improves the performance of the voltage controlled oscillator.

SUMMARY

One or more embodiments of the present disclosure provide a voltage controlled oscillator for flipped and complementary low noise. The voltage controlled oscillator includes a first resonant cavity, a second resonant cavity, and an associated circuit. The associated circuit may be configured to connect the first resonant cavity and the second resonant cavity in series and couple the first resonant cavity and the second resonant cavity. A resonant frequency of the first resonant cavity and a resonant frequency of the second resonant cavity may satisfy a first preset condition.

In some embodiments, the first resonant cavity may include a first negative resistance pair that are flipped and pulled up, and the second resonant cavity may include a second negative resistance pair that are flipped and pulled down. The first negative resistance pair and the second negative resistance pair may be in a complementary relationship.

In some embodiments, the first negative resistance pair may include a cross-connected NMOS transistor pair or an NPN transistor pair. Drains of the NMOS transistor pair or collectors of the NPN transistor pair may be connected to a high potential.

In some embodiments, the NMOS transistor pair may include an M1 and an M2. A substrate of the M1 may be connected to a gate, and a drain of the M1 may be connected to a gate of the M2. A substrate of the M2 may be connected to the gate, and a drain of the M2 may be connected to a gate of the M1. The NPN transistor pair may include a Q1 and a Q2. A substrate of the Q1 may be connected to a base, and a collector of the Q1 may be connected to a base of the Q2 through direct current isolation. A substrate of the Q2 may be connected to the base, and a collector of the Q2 may be connected to a base of the Q1 through the direct current isolation.

In some embodiments, the second negative resistance pair may include a cross-connected PMOS transistor pair or a PNP transistor pair. Drains of the PMOS transistor pair or collectors of the PNP transistor pair may be connected to a low potential.

In some embodiments, the PMOS transistor pair may include an M3 and an M4. A substrate of the M3 may be connected to a gate, and a drain of the M3 may be connected to a gate of the M4. A substrate of the M4 may be connected to the gate, and a drain of the M4 may be connected to a gate of the M3. The PNP transistor pair may include a Q3 and a Q4. A substrate of the Q3 may be connected to a base, and a collector of the Q3 may be connected to a base of the Q4 through direct current isolation. A substrate of the Q4 may be connected to the base, and a collector of the Q4 may be connected to a base of the Q3 through the direct current isolation.

In some embodiments, the first resonant cavity and the second resonant cavity may include at least one set of symmetrical devices, and the at least one set of symmetrical devices may include at least one set of parameters with a symmetry degree satisfying a second preset condition.

In some embodiments, the associated circuit may include a coupling circuit and a connecting circuit.

In some embodiments, the coupling circuit may include an electric coupling circuit and/or a magnetic coupling circuit.

In some embodiments, the connecting circuit may include an inductor. The inductor may be connected between a first connection point of the first negative resistance pair and a second connection point of the second negative resistance pair.

In some embodiments, the voltage controlled oscillator may be applied to a millimeter wave radar.

One or more embodiments of the present disclosure provide an oscillation circuit including a voltage controlled oscillator for flipped and complementary low noise. The oscillation circuit may include at least two voltage controlled oscillators for flipped and complementary low noise. The at least two voltage controlled oscillators for flipped and complementary low noise may be configured to be coupled to output two orthogonal oscillation signals.

One or more embodiments of the present disclosure provide an oscillation circuit including a voltage controlled oscillator for flipped and complementary low noise. The oscillation circuit may include at least two voltage controlled oscillators for flipped and complementary low noises.

The at least two voltage controlled oscillators for flipped and complementary low noise may be configured to be cascaded in series to form a cascade string. One terminal of the cascade string that is formed by the at least two voltage controlled oscillators for flipped and complementary low noise may be connected to a power supply, and another terminal may be grounded.

In some embodiments, a count of the voltage controlled oscillators for flipped and complementary low noise of the cascade string may not exceed a preset count. The preset count may be determined based on a voltage of the power supply and a voltage capacity of a negative resistance device.

In some embodiments, a cascade node of the oscillation circuit may be grounded through a capacitor.

BRIEF DESCRIPTION OF THE DRAWINGS

The present disclosure will be further described by way of exemplary embodiments, the exemplary embodiments are described in detail with reference to the drawings. These embodiments are non-limiting, and in these embodiments, the same number indicates the same structure, wherein.

DETAILED DESCRIPTION

In order to illustrate the technical solutions of the embodiments of the present disclosure more clearly, the following briefly introduces the drawings that need to be used in the description of the embodiments. Obviously, the accompanying drawings in the following description are only some examples or embodiments of the present disclosure, for those skilled in the art, the present disclosure may also be applied to other similar scenarios according to these drawings without any creative effort. Unless obviously obtained from the context or the context illustrates otherwise, the same numeral in the drawings refers to the same structure or operation.

It should be understood that the words "system", "device", "unit" and/or "module" used in the present disclosure are a method used to distinguish different components, elements, parts, portions, or assemblies of different levels. However, the words may be replaced by other expressions if other words can achieve the same purpose.

As indicated in the present disclosure and claims, the terms "a", "an", "one" and/or "the" are not specific to the singular and may include the plural unless the context clearly indicates an exception. Generally speaking, the terms "comprise" and "include" only suggest the inclusion of clearly identified steps and elements, and these steps and elements do not constitute an exclusive list, and the method or device may also contain other steps or elements.

Flowcharts are used in the present disclosure to illustrate the operations performed by the system according to the embodiments of the present disclosure. It should be understood that the preceding or following operations are not necessarily performed in the exact order. Instead, various steps may be processed in reverse order or simultaneously. At the same time, other operations may be added to these procedures, or a certain step or steps may be removed from these procedures.

Figure 1:
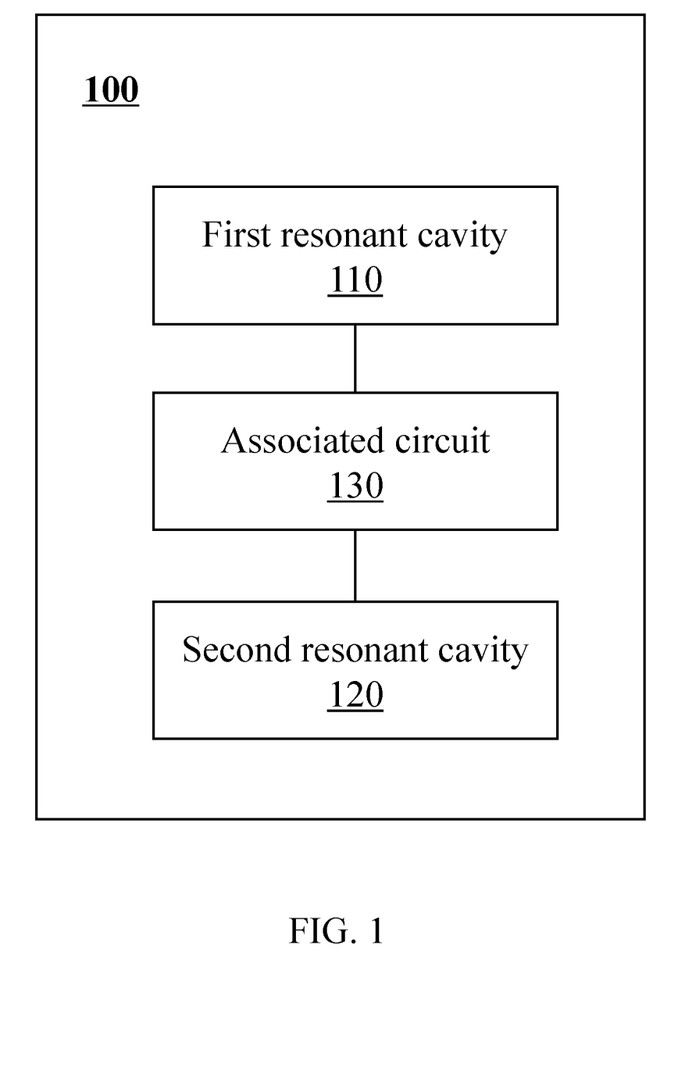
FIG. 1 is a block diagram illustrating an exemplary structure of a voltage controlled oscillator according to some embodiments of the present disclosure.

FIG. 1 is a block diagram illustrating an exemplary structure of a voltage controlled oscillator according to some embodiments of the present disclosure.

In some embodiments, as shown in FIG. 1, a voltage controlled oscillator 100 for flipped and complementary low noise may include a first resonant cavity 110, a second resonant cavity 120, and an associated circuit 130.

The flipped and complementary refers to negative resistance devices that are complementary to each other and a component connection manner that connection locations of the negative resistance devices are opposite to a common connection location. For example, the negative resistance devices may be flipped and pulled up or flipped and pulled down. More descriptions about being flipped and pulled up, being flipped and pulled down, and being complementary may be found in FIG. 2 and the related descriptions thereof.

The first resonant cavity 110 (or the second resonant cavity 120) may include a resonant circuit. In some embodiments, the first resonant cavity 110 (or the second resonant cavity 120) may generate resonance under an excitation of an input voltage to output an oscillation signal. A frequency of the oscillation signal output by the first resonant cavity 110 (or the second resonant cavity 120) may be automatically adjusted according to a change of a capacitance value of a capacitor included in the first resonant cavity 110 (or the second resonant cavity 120).

In some embodiments, the first resonant cavity 110 (or the second resonant cavity 120) may include an inductor, a capacitor, and negative resistance devices that are connected in parallel with each other. The negative resistance devices may be connected in a form of negative resistance pairs. The capacitor may be a switched capacitor or a capacitance adjustable component, which may be used to automatically adjust a capacitance value of the capacitor according to a change of voltage across terminals of the capacitor, so as to adjust a resonant frequency of the voltage controlled oscillator 100 for flipped and complementary low noise. The switched capacitor may include at least one capacitor array. The capacitance adjustable component may include at least one variable capacitor (e.g., a transistor). The capacitor array refers to an array composed of a plurality of switched capacitors.

Figure 3:
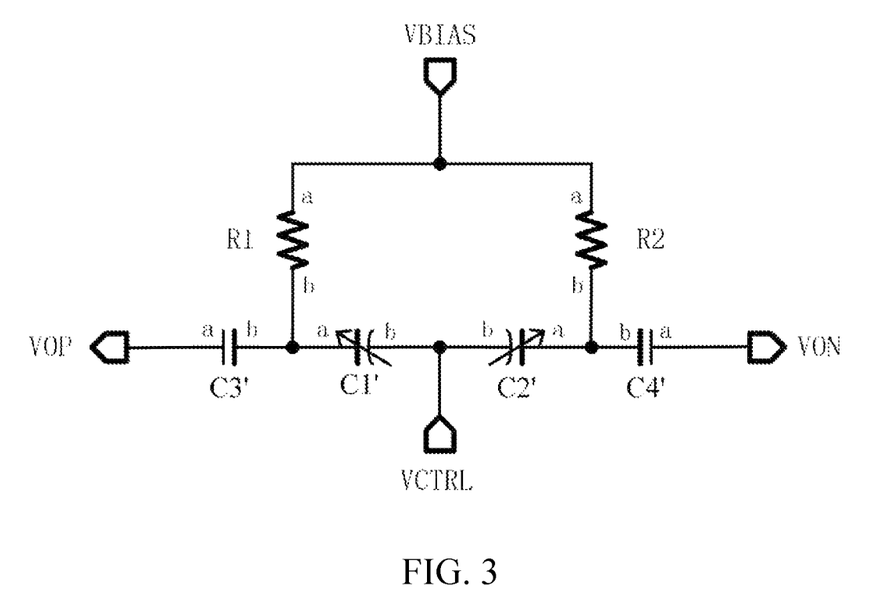
FIG. 3 is a schematic diagram illustrating an exemplary circuit structure of a variable capacitor with a transistor according to some embodiments of the present disclosure.

More descriptions about the variable capacitor (transistor) may be found in FIG. 3 and the related descriptions thereof.

In some embodiments, the first resonant cavity 110 (or the second resonant cavity 120) may also be a basic structure of other forms with the resonant circuit. For example, the first resonant cavity 110 (or the second resonant cavity 120) may be a topological connection manner that outputs the oscillation signal, which is not limited herein.

In some embodiments, a resonant frequency of the first resonant cavity 110 and a resonant frequency of the second resonant cavity 120 may satisfy a first preset condition. The first preset condition may include that a frequency ratio or a frequency difference between the resonant frequency of the first resonant cavity 110 and the resonant frequency of the second resonant cavity 120 does not exceed a preset range. For example, the frequency ratio may not exceed 100%±5%. As another example, the frequency difference may not exceed 500 KHz, etc.

Figure 2:
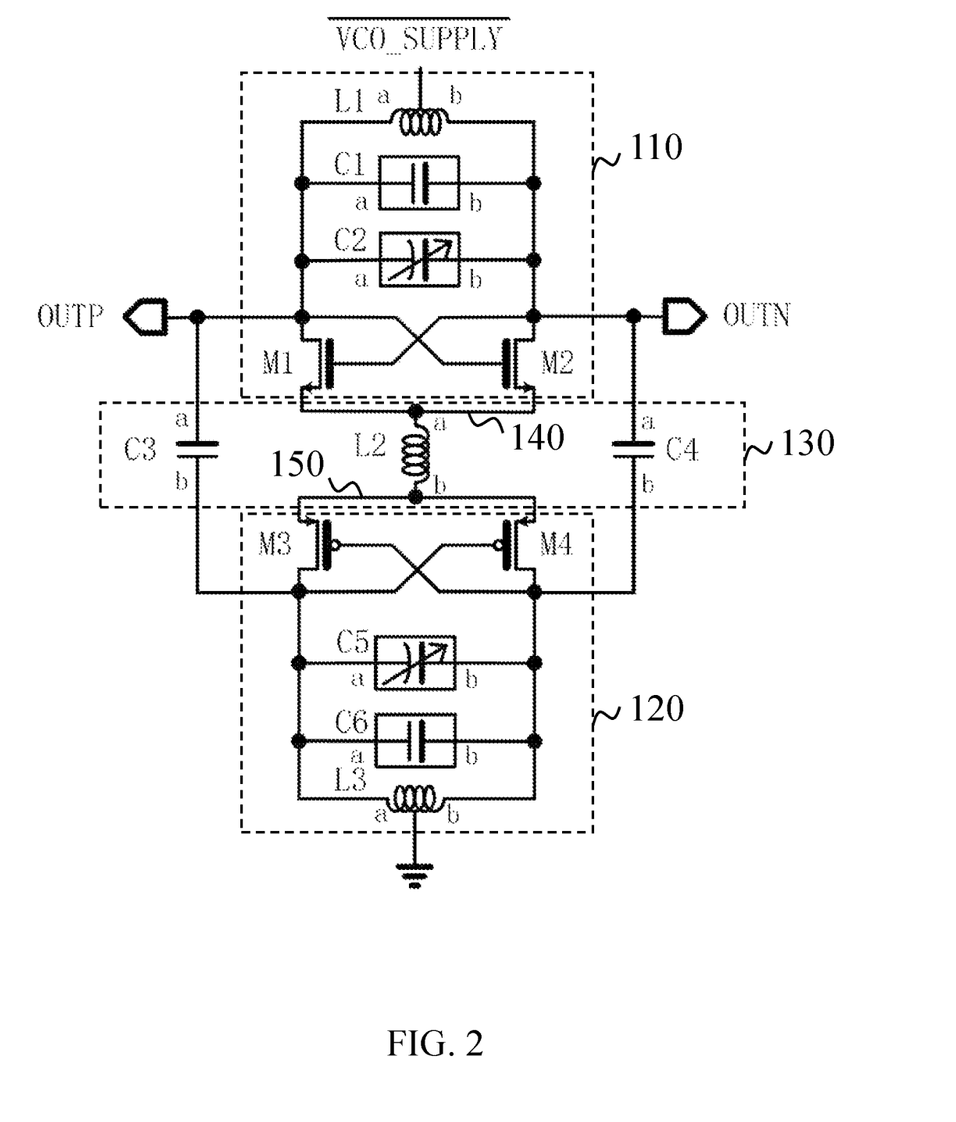
FIG. 2 is a schematic diagram illustrating an exemplary circuit structure of a voltage controlled oscillator according to some embodiments of the present disclosure.

More descriptions about the first resonant cavity 110 and the second resonant cavity 120 may be found in FIG. 2 and related descriptions thereof.

The associated circuit 130 may be a circuit configured to associate the first resonant cavity 110 with the second resonant cavity 120. In some embodiments, the associated circuit 130 may be used to connect the first resonant cavity 110 and the second resonant cavity 120 in series, and couple the first resonant cavity 110 and the second resonant cavity 120.

In some embodiments, the associated circuit 130 may be connected between the first resonant cavity 110 and the second resonant cavity 120 to connect the first resonant cavity 110 and the second resonant cavity 120 in series and couple the first resonant cavity 110 and the second resonant cavity 120. Coupling may make the first resonant cavity 110 and the second resonant cavity 120 interact with each other (i.e., coupling) to generate resonance, thereby enhancing an amplitude of the oscillation signal. Connection in series may make the first resonant cavity 110 and the second resonant cavity 120 reuse a current. That is, the current may flow through the first resonant cavity 110 with high potential and then flow to the second resonant cavity 120 with low potential, so that a noise generated by the first resonant cavity 110 may interfere with a noise generated by the second resonant cavity 120. That is, different noises generated by the first resonant cavity 110 and the second resonant cavity 120 may be synchronized in time, and waveforms of the noises may interfere with each other, thereby achieving a noise reduction effect. A form of the coupling may include at least one of an electric field coupling or a magnetic field coupling.

In some embodiments, the associated circuit 130 may include a conductive element (e.g., an inductor, an inductive load), which may be used to connect the first resonant cavity 110 and the second resonant cavity 120 in series. In some embodiments, the associated circuit 130 may also include a component capable of conducting an alternating current (e.g., a capacitor, a capacitive load), which may be used to couple the first resonant cavity 110 and the second resonant cavity 120.

The inductive load refers to a load element with an inductive feature, and a phase of a voltage of the inductive load may be ahead of a phase of the current. The capacitive load refers to a load element with a capacitive feature, and a phase of a voltage of the capacitive load may lag behind the phase of the current.

In some embodiments, the associated circuit 130 may also include some circuits or components with an inductive property in the first resonant cavity 110 and the second resonant cavity 120, and the circuits or components with an inductive property in the first resonant cavity 110 and the second resonant cavity 120 may couple with each other. In some embodiments, the circuits or components with an inductive feature in the first resonant cavity 110 and the second resonant cavity 120 may be coupled in a form of transformer coupling.

More descriptions about the associated circuit may be found in FIG. 2 and related descriptions thereof.

In some embodiments, by connecting the first resonant cavity 110 and the second resonant cavity 120 whose resonance frequencies satisfy the first preset condition in series and coupling the first resonant cavity 110 and the second resonant cavity 120 together, the first resonant cavity 110 and the second resonant cavity 120 may resonate and the amplitude of the output oscillation signal may be enhanced, which may reduce a phase noise and reuse a current between the first resonant cavity 110 and the second resonant cavity 120, thereby making noises generated by the first resonant cavity 110 and the second resonant cavity 120 interfere with each other, achieving the noise reduction effect, and further reducing the phase noise.

In some embodiments, a plurality of voltage controlled oscillators 100 for flipped and complementary low noise may be connected or coupled together in various forms to form an oscillation circuit including a voltage controlled oscillator for flipped and complementary low noise. More descriptions about the oscillation circuit including a voltage controlled oscillator for flipped and complementary low noise may be found in FIG. 5, FIG. 6, and FIG. 7 and the related descriptions thereof.

In some embodiments, the voltage controlled oscillator for flipped and complementary low noise may be applied to a millimeter wave radar. For example, the voltage controlled oscillator 100 for flipped and complementary low noise may be connected to a transmitter, the oscillation signal may be generated by the voltage controlled oscillator 100 for flipped and complementary low noise, and then the oscillation signal may be sent through the transmitter.

In some embodiments, the voltage controlled oscillator 100 for flipped and complementary low noise may be applied to the millimeter wave radar to reduce the phase noise as much as possible and improve the quality of the oscillation signal sent by the millimeter wave radar under a condition that a tuning frequency rises to a millimeter wave frequency band, a voltage/frequency gain is relatively large, and a noise performance of a semiconductor device is poor.

It should be noted that the above description of the voltage controlled oscillator 100 for flipped and complementary low noise and its components are only for convenience of description and do not limit the present disclosure to the scope of the illustrated embodiments. It should be understood that for those skilled in the art, after understanding the principle of the system, it is possible to combine various modules arbitrarily or form a subsystem to connect with other modules without departing from the principle. In some embodiments, the first resonant cavity 110, the second resonant cavity 120, and the associated circuit 130 disclosed in FIG. 1 may be different parts of a circuit or may crossover and overlap. For example, an inductor L1 of the first resonant cavity 110 may also act as a coupling circuit in the associated circuit. Such deformations are within the protection scope of the present disclosure.

FIG. 2 is a schematic diagram illustrating an exemplary circuit structure of a voltage controlled oscillator according to some embodiments of the present disclosure.

In some embodiments, the first resonant cavity 110 may include a first negative resistance pair that are flipped and pulled up, and the second resonant cavity 120 may include a second negative resistance pair that are flipped and pulled down. In some embodiments, the first negative resistance pair and the second negative resistance pair may be in a complementary relationship.

A negative resistance pair may be a circuit composed of two negative resistance devices. When a voltage of the negative resistance pair decreases, a current flowing through the negative resistance pair may increase, thus, the negative resistance pair may exhibit negative resistance characteristics. The negative resistance pair may generate a self-oscillation, compensate for an energy loss of a resonant circuit, amplify an oscillation signal, and maintain a stable oscillation of a circuit in a voltage controlled oscillator 100 for flipped and complementary low noise.

In some embodiments, the negative resistance device may include at least one of a tunnel diode, a reverse bias diode, a triode, a field effect transistor, etc. In some embodiments, the two negative resistance devices forming a negative resistance pair may be of a same type. In some embodiments, the two negative resistance devices may form a negative resistance pair through a cross-coupling connection.

Being flipped and pulled up refers to that a negative resistance device that is usually connected to a low potential may be connected to a high potential in an opposite manner. Being flipped and pulled down refers to that a negative resistance device that is usually connected to a high potential may be connected to a low potential in an opposite manner.

For example, taking a circuit composed of a PMOS transistor (P-type metal-oxide-semiconductor field-effect transistor) and an NMOS transistor (N-type metal-oxide-semiconductor field-effect transistor) as an example, the PMOS transistor may be usually used as an upper transistor, which is connected to the high potential, and the NMOS transistor may be usually used as a lower transistor, which is connected to the low potential. The NMOS transistor that is flipped and pulled up may be used as the upper transistor, which is connected to the high potential. The PMOS transistor that is flipped and pulled down may be used as the lower transistor, which is connected to the low potential.

It should be understood that the low or high potential may not refer to a potential with a specific value. The low potential refers to a relatively low potential in a circuit. The high potential refers to a relatively high potential in a circuit.

In some embodiments, the first negative resistance pair that are flipped and pulled up may be connected in parallel with an inductor or a capacitor in the first resonant cavity 110. In some embodiments, the second negative resistance pair that are flipped and pulled down may be connected in parallel with an inductor or a capacitor in the second resonant cavity 120. In some embodiments, the associated circuit 130 may connect the first resonant cavity 110 and the second resonant cavity 120 in series by electrically connecting the first negative resistance pair and the second negative resistance pair.

The complementary relationship may indicate that a conductive property of the first negative resistance pair and a conductive property of the second negative resistance pair may be opposite. For example, a current direction of the NMOS transistor may be from a drain to a source, while a current direction of the PMOS transistor may be from a source to a drain. The NMOS transistor and the PMOS transistor may be in a complementary relationship. As another example, a current direction of the NPN transistor may be from a collector to an emitter, while a current direction of the PNP transistor may be from an emitter to a collector. The NPN transistor and the PNP transistor may be in a complementary relationship.

In some embodiments, the first negative resistance pair may include a cross-connected NMOS transistor pair or an NPN transistor pair. Drains of the NMOS transistor pair or collectors of the NPN transistor pair may be connected to the high potential.

A cross-connection refers to a connection that is crossed in a signal path and achieves an energy transmission. For example, for each NMOS transistor in the NMOS transistor pair, a gate of the each NMOS transistor may be connected to a drain of another NMOS transistor to form two signal paths from the gate to the drain, and the two signal paths may be crossed with each other and achieve the energy transmission, thereby forming the cross-connected NMOS transistor pair.

In some embodiments, the voltage controlled oscillator 100 for flipped and complementary low noise may include an NPN transistor Q1 and an NPN transistor Q2. An NPN transistor pair may be formed by the NPN transistor Q1 and the NPN transistor Q2. A collector of the NPN transistor Q1 may be connected to a base of the NPN transistor Q2 through direct current isolation, and a collector of the NPN transistor Q2 may be connected to a base of the NPN transistor Q1 through the direct current isolation. A connection through direct current isolation refers to isolating a direct current signal between the NPN transistor Q1 and the NPN transistor Q2, and merely transmitting an alternating-current signal. For example, the connection through direct current isolation may include connecting the collector of the NPN transistor Q1 to the base of the NPN transistor Q2 through a first coupling capacitor. In some embodiments, a bias circuit may be added to the base of the NPN transistor Q1 and the base of the NPN transistor Q2 to ensure a stability of the circuit. The bias circuit may include a resistance bias, a constant current source bias, or the like.

In some embodiments, as shown in FIG. 2, the voltage controlled oscillator 100 for flipped and complementary low noise may include an NMOS transistor M1 and an NMOS transistor M2. An NMOS transistor pair may be formed by the NMOS transistor M1 and the NMOS transistor M2. A drain of the NMOS transistor M1 may be connected to a gate of the NMOS transistor M2, and a drain of the NMOS transistor M2 may be connected to a gate of the NMOS transistor M1.

In some embodiments, the drains of the NMOS transistor pair may be connected to the high potential. In some embodiments, the collectors of the NPN transistor pair may be connected to the high potential.

The high potential may be a power supply or may be a potential that is lower than the power supply but still belongs to a higher potential point in a circuit. For example, as shown in FIG. 2, the first resonant cavity 110 may include an inductor L1. The center tap of the inductor L1 may be connected to the power supply. Two terminals of the inductor L1 may include a terminal a and a terminal b, respectively, so that the terminal a and the terminal b of the inductor L1 may be the high potential.

In some embodiments, in the voltage controlled oscillator 100 for flipped and complementary low noise, the drain of the NMOS transistor M1 may be connected to the gate of the NMOS transistor M2, and the drain of the NMOS transistor M1 may be connected to the terminal a of the inductor L1. The drain of the NMOS transistor M2 may be connected to the gate of the NMOS transistor M1, and the drain of the NMOS transistor M2 may be connected to the terminal b of the inductor L1.

In some embodiments, a substrate of the NMOS transistor M1 and a substrate of the NMOS transistor M2 may be connected to the low potential.

In some embodiments, other connections in a form of substrate injection may also be arranged for the NMOS transistor M1 and the NMOS transistor M2, or the NPN transistor Q1 and the NPN transistor Q2. More descriptions about specific connection manners may be found in FIG. 4 and related descriptions thereof.

In some embodiments, the second negative resistance pair may include a cross-connected PMOS transistor pair or a PNP transistor pair. Drains of the PMOS transistor pair or collectors of the PNP transistor pair may be connected to the low potential.

In some embodiments, the voltage controlled oscillator 100 for flipped and complementary low noise may include a PNP transistor Q3 and a PNP transistor Q4. A PNP transistor pair may be formed by the PNP transistor Q3 and the PNP transistor Q4. A collector of the PNP transistor Q3 may be connected to a base of the PNP transistor Q4 through the direct current isolation, and a collector of the PNP transistor Q4 may be connected to a base of the PNP transistor Q3 through the direct current isolation. More content about the connection through direct current isolation may be found in the relevant descriptions above in the present disclosure.

In some embodiments, as shown in FIG. 2, the voltage controlled oscillator 100 for flipped and complementary low noise may include a PMOS transistor M3 and a PMOS transistor M4. A PMOS transistor pair may be formed by the PMOS transistor M3 and the PMOS transistor M4. A drain of the PMOS transistor M3 may be connected to a gate of the PMOS transistor M4, and a drain of the PMOS transistor M4 may be connected to a gate of the PMOS transistor M3;

In some embodiments, the drains of the PMOS transistor pair may be connected to the low potential. In some embodiments, the collectors of the PNP transistor pair may be connected to the low potential.

The low potential may be a ground or may be a potential that is higher than the ground but still belongs to a lower potential point in the circuit. For example, as shown in FIG. 2, the second resonant cavity 120 may include an inductor L3. A center tap of the inductor L3 may be grounded. Two terminals of the inductor L3 may include a terminal a and a terminal b, respectively, and the terminal a and the terminal b of the inductor L3 may be the low potential.

In some embodiments, in the voltage controlled oscillator 100 for flipped and complementary low noise, the drain of the PMOS transistor M3 may be connected to the gate of the PMOS transistor M4, and the drain of the PMOS transistor M3 may be connected to the terminal a of the inductor L3. The drain of the PMOS transistor M4 may be connected to the gate of the PMOS transistor M3, and the drain of the PMOS transistor M4 may be connected to the terminal b of the inductor L3.

In some embodiments, a substrate of the PMOS transistor M3 and a substrate of the PMOS transistor M4 may be connected to the high potential.

In some embodiments, other connections in the form of substrate injection may also be arranged for the PMOS transistor M3 and the PMOS transistor M4, or PNP transistor Q3 and the PNP transistor Q4. More descriptions about specific connection manners may be found in FIG. 4 and the related descriptions thereof.

In some embodiments, a position of the negative resistance pair may be flipped, and a flipped first negative resistance pair may be electrically connected to a flipped second negative resistance pair, so that the first resonant cavity 110 and the second resonant cavity 120 may be connected in series. Such connection may dissolve a coupling relationship between a differential signal and a common mode signal, which makes a noise reduction possible for the common mode signal alone, thereby facilitating a noise generated by the first resonant cavity 110 to be interfered with a noise generated by the second resonant cavity 120 through the associated circuit to achieve a noise reduction effect.

In some embodiments, the first resonant cavity 110 and the second resonant cavity 120 may include at least one set of symmetrical devices. In some embodiments, the at least one set of symmetrical devices may include at least one set of parameters with a symmetry degree satisfying a second preset condition.

The symmetrical devices refer to devices appearing in pairs in a circuit. For example, the second resonant cavity 120 may include an identical or complementary component as a component included in the first resonant cavity 110. Complementarity refers to opposite conductive properties of components.

The symmetry degree may be used to measure a symmetry degree of components in two circuits and the symmetry degree may be related to the parameters of the components. The symmetry degree may indicate at least one of whether components at corresponding positions in the first resonant cavity 110 and the second resonant cavity 120 are of a same type, a same quantity, a same material, a same size, or transistors are complementary to each other, etc. In some embodiments, the symmetry degree may be represented by a value from 0 to 1. The closer to 1, the greater the symmetry degree may be. The symmetry degree may be determined based on experience.

The second preset condition refers to a condition that needs to be satisfied when the components are symmetrical. The second preset condition may include that the symmetry degree is greater than or equal to a preset threshold.

In some embodiments, the first resonant cavity 110 and the second resonant cavity 120 may include capacitors and inductors of a same type, a same quantity, a same material, a same size, and a same arrangement. The first resonant cavity 110 and the second resonant cavity 120 may also include negative resistance pairs with a same quantity and in a complementary relationship.

In some embodiments, as shown in FIG. 2, the voltage controlled oscillator 100 for flipped and complementary low noise may further include a capacitor array C1, a variable capacitance adjustable component C2, a variable capacitance adjustable component C5, a capacitor array C6, a port OUTP, and a port OUTN. The inductor L1, the capacitor array C1, and the variable capacitance adjustable component C2 may be connected in parallel. The inductor L3, the capacitance adjustable component C5, and the capacitor array C6 may be connected in parallel. A source of the NMOS transistor M1 may be connected to a source of the NMOS transistor M2, and a source of the PMOS transistor M3 may be connected to a source of the PMOS transistor M4. The port OUTP may be connected to the drain of the NMOS transistor M1, and the port OUTN may be connected to the drain of the NMOS transistor M2. The differential signal may flow out from the port OUTP and the port OUTN. The NMOS transistor M1 may be the same as the NMOS transistor M2, the capacitor array C1 may be the same as the capacitor array C6, the capacitance adjustable component C2 may be the same as the capacitance adjustable component C5, and the PMOS transistor M3 may be the same as the PMOS transistor M4.

In some embodiments, the capacitor array C1 and the capacitor array C6 may include a switched capacitor array. More descriptions about the inductor L1, the inductor L3, the NMOS transistor M1, and the NMOS transistor M2 may be found in relevant descriptions above. More descriptions about the capacitance adjustable component C2 and the capacitance adjustable component C5 may be found in FIG. 3 and the related descriptions thereof.

In some embodiments, the symmetrical devices may be arranged for the first resonant cavity 110 and the second resonant cavity 120, thereby reducing a difficulty of a circuit design and an unevenness of the circuit, and improving the performance and stability of the circuit.

In some embodiments, the associated circuitry 130 may include a coupling circuit and a connecting circuit.

The coupling circuit refers to a circuit in which components in different parts of the circuit may interact with each other. For example, the coupling circuit may include a direct coupling circuit, a common mode/differential mode coupling circuit, or the like.

In some embodiments, the coupling circuit may include an electric coupling circuit and/or a magnetic coupling circuit.

In some embodiments, the electric coupling circuit may include a capacitor, and the first resonant cavity 110 and the second resonant cavity 120 may be connected to the capacitor to achieve the electric coupling. For example, as shown in FIG. 2, the capacitor may include a capacitor C3 and a capacitor C4. The capacitor C3 may be the same as the capacitor C4. A terminal a of the capacitor C3 may be connected to the drain of the NMOS transistor M1, a terminal b of the capacitor C3 may be connected to the drain of the PMOS transistor M3, a terminal a of the capacitor C4 may be connected to the drain of the NMOS transistor M2, and a terminal b of the capacitor C4 may be connected to the drain of the PMOS transistor M4, so as to realize an electric coupling between the first resonant cavity 110 and the second resonant cavity 120.

In some embodiments, the magnetic coupling circuit may include an inductor. The first resonant cavity 110 may be magnetically coupled to the second resonant cavity 120 through the inductor. In some embodiments, as shown in FIG. 2, the inductor may include the inductor L1 of the first resonant cavity 110 and the inductor L3 of the second resonant cavity 120. The inductor L1 and the inductor L3 may be mutually inducted in a form of a transformer, so that the first resonant cavity 110 may be magnetically coupled to the second resonant cavity 120. More descriptions about the transformer may be found in FIG. 1 and the related descriptions thereof.

The connecting circuit may be a circuit that realizes an electric connection. The connecting circuit may connect the first resonant cavity 110 and the second resonant cavity 120 in series through the electric connection to reuse a current between the first resonant cavity 110 and the second resonant cavity 120. For example, the connecting circuit may include cables, wires, or the like. In some embodiments, the connecting circuit may include an inductive device, such as an inductor, an inductive resistor, or the like.

In some embodiments, as shown in FIG. 2, the connecting circuit may include the inductor L2. The inductor L2 may be connected between a first connection point 140 of the first negative resistance pair and a second connection point 150 of the second negative resistance pair. A terminal a of the inductor L2 may be connected to the first connection point 140, and a terminal b of the inductor L2 may be connected to the second connection point 150.

In some embodiments, the inductor L2 may be connected between the first resonant cavity 110 and the second resonant cavity 120 (i.e., between the first connection point 140 and the second connection point 150). The first resonant cavity 110 and the second resonant cavity 120 may include the symmetrical devices. A divided voltage of the inductor L2 may be (or close to) half of a voltage of the power supply, and a voltage of the inductor L2 may be a common mode voltage of the first negative resistance pair and the second negative resistance pair.

In some embodiments, the two terminals of the inductor L2 may generate oscillate at twice the resonant frequency of the voltage controlled oscillator 100 for flipped and complementary low noise, thereby achieving an effect of filtering and noise reduction through a second harmonic resonance and further improving a phase noise performance.

In some embodiments, a voltage control circuit may be connected to the terminals of the inductor L2, so that when the resonant frequency of the voltage controlled oscillator 100 for flipped and complementary low noise changes, an oscillation frequency of the inductor L2 may be adjusted accordingly, which is beneficial for the inductor L2 to adapt to a change in circuit parameters, thereby improving a second resonance effect. A specific implementation of the voltage control circuit may be found in a related circuit of the capacitance adjustable component in FIG. 3.

FIG. 3 is a schematic diagram illustrating an exemplary circuit structure of a variable capacitor with a transistor according to some embodiments of the present disclosure.

In some embodiments, a capacitance adjustable component may be a variable capacitor with at least one transistor. In some embodiments, the capacitance adjustable component may be connected in parallel with an inductor and a negative resistance to form a resonant cavity. For example, the capacitance adjustable component C2 may be connected in parallel with the inductor L1 and a first negative resistance pair to form the first resonant cavity 110. In some embodiments, a capacitance value of the capacitance adjustable component may be automatically adjusted according to a change of a voltage across terminals of the capacitance adjustable component. A change of the capacitance value may cause a change of a resonant frequency, so that the capacitance adjustable component may be configured to adjust a resonant frequency of the voltage controlled oscillator 100 for flipped and complementary low noise.

In some embodiments, as shown in FIG. 3, the capacitance adjustable component C2 or C5 may be composed of variable capacitors C1' and CT with transistors, capacitors C3' and C4', resistors R1 and R2, and four ports VOP, VON, VCTRL, and VIBIAS. The port VOP may be connected to a terminal a of the capacitor C3', and a terminal b of the capacitor C3' may be connected to a terminal b of the resistor R1 and a terminal a of the variable capacitor C1' with a transistor. The port VON may be connected to a terminal a of the capacitor C4', and a terminal b of the capacitor C4' may be connected to a terminal b of the resistor R2 and a terminal a of the variable capacitor C2' with a transistor. The port VCTRL may be connected to a terminal b of the variable capacitor C1' with a transistor and a terminal b of the variable capacitor C2' with a transistor, and the port VIBIAS may be connected to a terminal a of the resistor R1 and a terminal a of the resistor R2.

In some embodiments, the variable capacitor C1' with a transistor may be the same as the variable capacitor C2' with a transistor, the capacitor C3' may be the same as the capacitor C4', and the resistor R1 may be the same as the resistor R2.

In some embodiments, a capacitance value of the capacitance adjustable component C2 or C5 may be changed by changing a voltage of the port VCTRL, so that a center frequency (i.e., the resonance frequency) of the voltage controlled oscillator 100 for flipped and complementary low noise may be changed.

Figure 4:
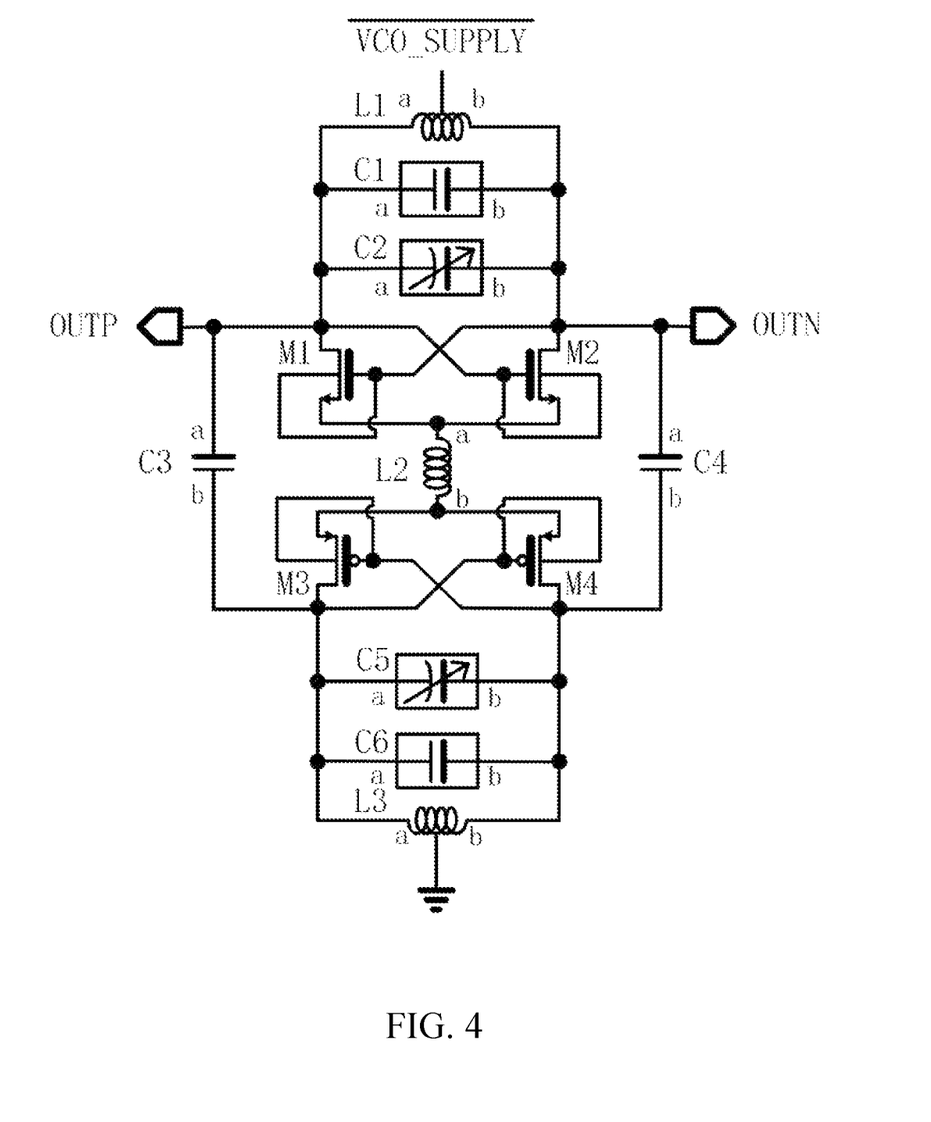
FIG. 4 is a schematic diagram illustrating an exemplary circuit structure of a voltage controlled oscillator in a form of substrate injection according to some embodiments of the present disclosure.

FIG. 4 is a schematic diagram illustrating an exemplary circuit structure of a voltage controlled oscillator in a form of substrate injection according to some embodiments of the present disclosure.

In some embodiments, a connection in the form of substrate injection may also be arranged for the NMOS transistor M1 and the NMOS transistor M2.

For example, as shown in FIG. 4, an NMOS transistor pair may include the M1 and M2. A substrate of the M1 may be connected to a gate of the M1, and a drain of the M1 may be connected to a gate of the M2. A substrate of M2 may be connected to the gate of M2, and a drain of the M2 may be connected to the gate of the M1.

In some embodiments, a connection in the form of substrate injection may also be arranged for the PMOS transistor M3 and the PMOS transistor M4.

For example, as shown in FIG. 4, a PMOS transistor pair may include the M3 and M4. A substrate of the M3 may be connected to a gate of the M3, and a drain of the M3 may be connected to a gate of the M4. A substrate of the M4 may be connected to the gate of the M4, and a drain of the M4 may be connected to the gate of the M3.

Other connection manners for the voltage controlled oscillator 100 for flipped and complementary low noise may be found in FIG. 2 and related descriptions thereof.

In some embodiments, similar to the NMOS transistors M1 and M2, and the PMOS transistors M3 and M4, the connection in the form of substrate injection may also be arranged for NPN transistors Q1 and Q2, and PNP transistors Q3 and Q4.

For example, a substrate of the Q1 may be connected to a base of the Q1, and a collector of the Q1 may be connected to a base of the Q2 through direct current isolation. A substrate of the Q2 may be connected to a base of the Q2, and a collector of the Q2 may be connected to a base of the Q1 through the direct current isolation. As another example, a substrate of the Q3 may be connected to a base of the Q3, and a collector of the Q3 may be connected to a base of the Q4 through the direct current isolation. A substrate of the Q4 may be connected to a base of the Q4, and a collector of the Q4 may be connected to a base of the Q3 through the direct current isolation.

Other connection manners for the voltage controlled oscillator 100 for flipped and complementary low noise and more descriptions about the NPN transistors Q1, Q2, the PNP transistors Q3, Q4, and a connection through direct current isolation may be found in FIG. 2 and related descriptions thereof.

In some embodiments, the substrate injection may be formed by connecting the substrates of the NMOS transistor M1 and the NMOS transistor M2 to the respective gates and connecting the substrates of the PMOS transistor M3 and the PMOS transistor M4 to the respective gates. The substrate injection may inject a signal into the substrate, which increases a transconductance (gm) of a transistor, so that a transistor with a smaller size may be used to reduce a current and a flicker noise. In addition, a switching state of the transistor may be switched more quickly, thereby strengthening a degree of turn-on and turn-off, improving signal strength, and further reducing phase noises.

In some embodiments, voltage controlled oscillators for flipped and complementary low noise that are in a form of substrate injection may be connected or coupled together in various forms to form an oscillation circuit including a voltage controlled oscillator for flipped and complementary low noise. More descriptions about the oscillation circuit including a voltage controlled oscillator for flipped and complementary low noise may be found in FIGS. 6 and 7 and the related descriptions thereof.

Figure 5:
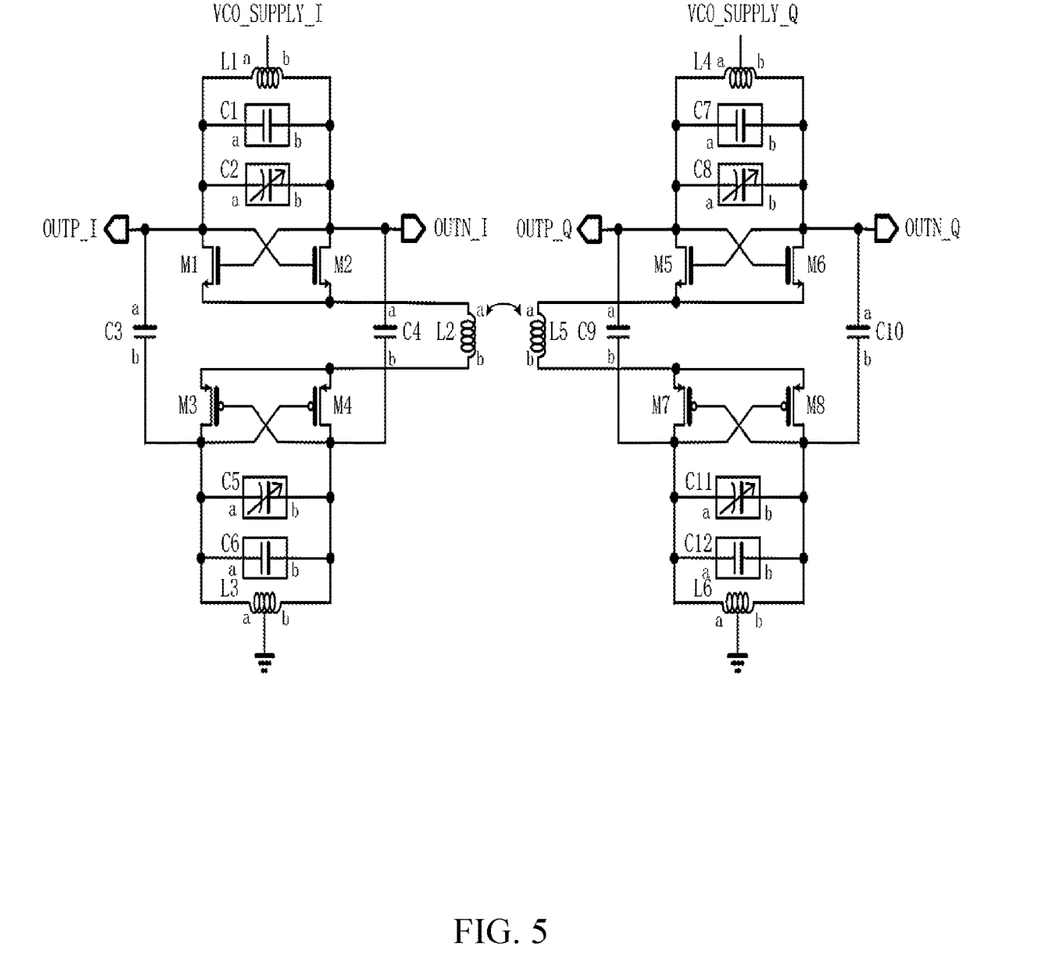
FIG. 5 is a schematic diagram illustrating an exemplary circuit structure of an oscillation circuit that outputs two orthogonal oscillation signals according to some embodiments of the present disclosure.

FIG. 5 is a schematic diagram illustrating an exemplary circuit structure of an oscillation circuit that outputs two orthogonal oscillation signals according to some embodiments of the present disclosure.

A plurality of voltage controlled oscillators 100 for flipped and complementary low noise may be connected or coupled together in various forms to form an oscillation circuit including a voltage controlled oscillator for flipped and complementary low noise.

In some embodiments, the oscillation circuit may include at least two voltage controlled oscillators 100 for flipped and complementary low noise. The at least two voltage controlled oscillators for flipped and complementary low noise may be coupled to output two orthogonal oscillation signals. The two orthogonal oscillation signals may include an I-channel differential signal and a Q-channel differential signal, that is, IQ orthogonal oscillation signals. More details may be found in the following descriptions.

In some embodiments, the two voltage controlled oscillators 100 for flipped and complementary low noise may be coupled through a connecting circuit in an associated circuit.

In some embodiments, as shown in FIG. 5, the oscillation circuit may include a first voltage controlled oscillator for flipped and complementary low noise and a second voltage controlled oscillator for flipped and complementary low noise. A connecting circuit of an associated circuit in the first voltage controlled oscillator for flipped and complementary low noise may include the inductor L2. A connecting circuit of an associated circuit in the second voltage controlled oscillator for flipped and complementary low noise may include the inductor L5. The first voltage controlled oscillator for flipped and complementary low noise and the second voltage controlled oscillator for flipped and complementary low noise may be magnetically coupled through the inductor L2 and the inductor L5. The first voltage controlled oscillator for flipped and complementary low noise may output the I-channel differential signal through the ports OUTP_I and OUTN_I. The second voltage controlled oscillator for flipped and complementary low noise may output the Q-channel differential signal through the ports OUTP_Q and OUTN_Q. The I-channel differential signal and the Q-channel differential signal may be the IQ orthogonal oscillation signals.

Connection manners of other components in the first voltage controlled oscillator for flipped and complementary low noise and the second voltage controlled oscillator for flipped and complementary low noise may be found in FIGS. 2, 3, and 4 and the related descriptions thereof.

In some embodiments, components in the first voltage controlled oscillator for flipped and complementary low noise and the second voltage controlled oscillator for flipped and complementary low noise may be arranged to be symmetrical. A symmetrical arrangement may indicate that the first voltage controlled oscillator for flipped and complementary low noise and the second voltage controlled oscillator for flipped and complementary low noise may be configured with components of a same quantity and same parameters at corresponding positions.

In some embodiments, a third coupling capacitor may be connected between a terminal a of the inductor L2 and a terminal a of the inductor L5, and a fourth coupling capacitor may be connected between a terminal b of the inductor L2 and a terminal b of the inductor L5. The first voltage controlled oscillator for flipped and complementary low noise and the second voltage controlled oscillator for flipped and complementary low noise may be electrically coupled through the third coupling capacitor and the fourth coupling capacitor.

In some embodiments, the inductor L2 and the inductor L5 may be coupled between two identical oscillators to form an orthogonal of the I-channel and the Q-channel, thereby outputting the IQ orthogonal oscillation signals.

Figure 6:
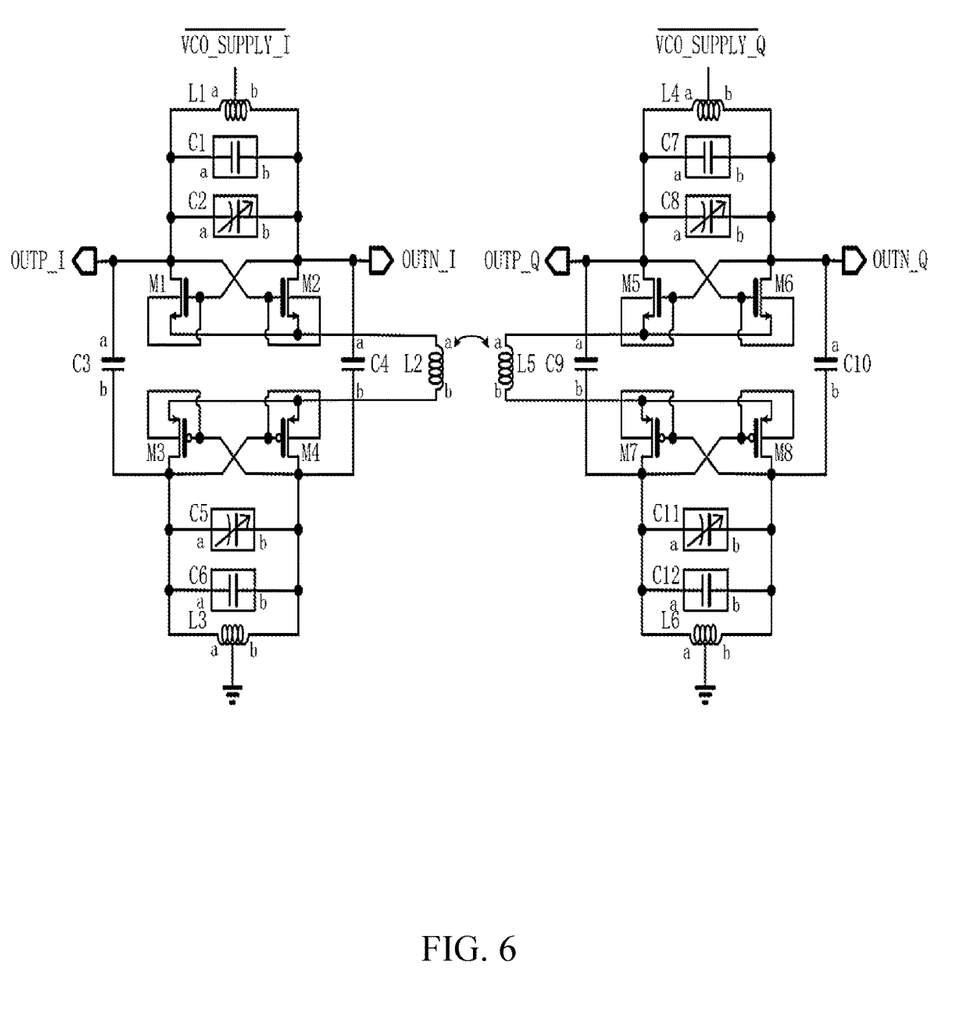
FIG. 6 is a schematic diagram illustrating an exemplary circuit structure of an oscillation circuit that outputs two orthogonal oscillation signals in a form of substrate injection according to some embodiments of the present disclosure.

FIG. 6 is a schematic diagram illustrating an exemplary circuit structure of an oscillation circuit that outputs two orthogonal oscillation signals in a form of substrate injection according to some embodiments of the present disclosure.

A plurality of voltage controlled oscillators 100 for flipped and complementary low noise in a form of substrate injection may be connected or coupled together to form an oscillation circuit including a voltage controlled oscillator for flipped and complementary low noise in a form of substrate injection.

In some embodiments, as shown in FIG. 6, the oscillation circuit may include at least two voltage controlled oscillators for flipped and complementary low noise in a form of substrate injection. The at least two voltage controlled oscillators for flipped and complementary low noise in a form of substrate injection may be coupled to output two orthogonal oscillation signals.

In some embodiments, a manner of magnetically coupling or electrically coupling the two voltage controlled oscillators for flipped and complementary low noise in a form of substrate injection may be found in FIG. 5 and the related descriptions thereof.

In some embodiments, components in the two voltage controlled oscillators for flipped and complementary low noise in a form of substrate injection may be arranged to be symmetrical.

Connection manners of the two voltage controlled oscillators for flipped and complementary low noise in a form of substrate injection and their components may be found in FIG. 2, FIG. 3, and FIG. 4 and the related descriptions thereof.

In some embodiments, the voltage controlled oscillators for flipped and complementary low noise in a form of substrate injection may be coupled to form an oscillation circuit that outputs the orthogonal oscillation signals, which satisfies an engineering requirement of the orthogonal oscillation signals, improves the transconductance (gm) of a transistor, and reduces a flicker noise and phase noise.

Figure 7:
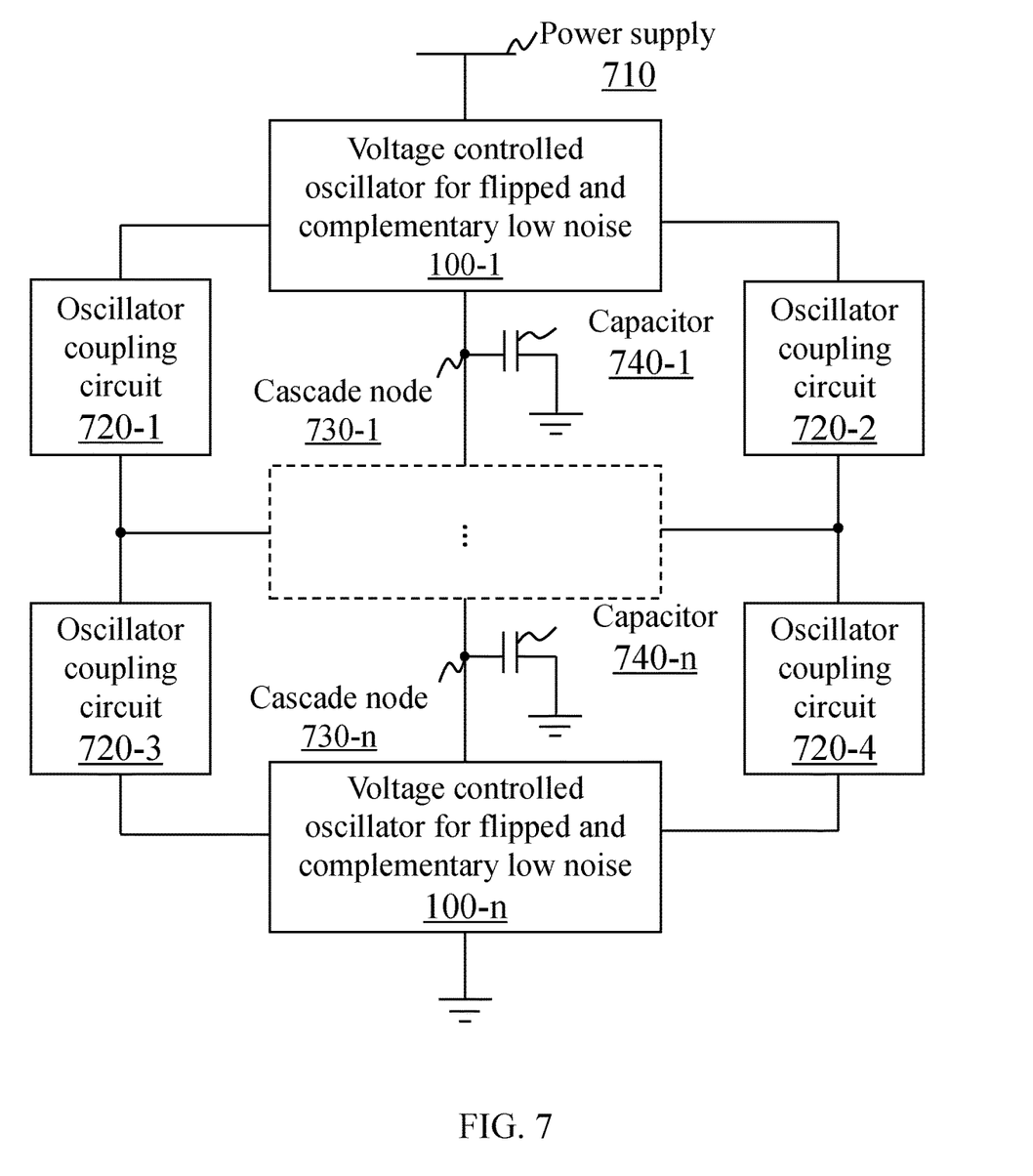
FIG. 7 is a block diagram illustrating an exemplary structure of a voltage controlled oscillator cascade according to some embodiments of the present disclosure.

FIG. 7 is a block diagram illustrating an exemplary structure of a voltage controlled oscillator cascade according to some embodiments of the present disclosure.

A plurality of voltage controlled oscillators 100 for flipped and complementary low noise or a plurality of voltage controlled oscillators for flipped and complementary low noise in a form of substrate injection may be cascaded to form an oscillation circuit including a voltage controlled oscillator for flipped and complementary low noise.

In some embodiments, as shown in FIG. 7, an oscillation circuit may include at least two voltage controlled oscillators for flipped and complementary low noise (e.g., a voltage controlled oscillator 100-1 for flipped and complementary low noise, . . . , a voltage controlled oscillator 100-n for flipped and complementary low noise). The at least two voltage controlled oscillators for flipped and complementary low noise may be cascaded in series to form a cascade string. One terminal of the cascade string that is formed by the at least two voltage controlled oscillators for flipped and complementary low noise may be connected to a power supply 710, and another terminal may be grounded.

The oscillation circuit formed by cascading the at least two voltage controlled oscillators for flipped and complementary low noise may work at a higher voltage of the power supply 710. Under the premise of reliability, an oscillation circuit formed by cascading may have better noise performance.

In some embodiments, cascading in series may include a direct connection. For example, for the cascade string, the voltage controlled oscillators for flipped and complementary low noise may be arranged from a high potential to a low potential of the oscillation circuit in sequence in a direction from the power supply 710 to the ground. In some embodiments, a voltage controlled oscillator for flipped and complementary low noise at a relatively higher potential may be directly connected to a next neighbor voltage controlled oscillator for flipped and complementary low noise at a relatively lower potential. For example, an inductor of a second resonant cavity of the voltage controlled oscillator for flipped and complementary low noise at a relatively higher potential may be directly connected to an inductor of a first resonant cavity of the next neighbor voltage controlled oscillator for flipped and complementary low noise at a relatively lower potential.

In some embodiments, an oscillation signal of each voltage controlled oscillator for flipped and complementary low noise in the cascade string may be led out via the port OUTP and the port OUTN along signal leading-out wires. In some embodiments, each port OUTP may be coupled through an oscillator coupling circuit (e.g., 720-1, 720-3, or the like), and each port OUTN may be coupled through an oscillator coupling circuit (e.g., 720-2, 720-4, or the like), thereby outputting a coupled oscillation signal via an output port of the oscillation circuit.

In some embodiments, the oscillator coupling circuit may include a capacitor. More manners to implement the oscillator coupling circuit may be found in a coupling circuit illustrated in FIG. 2 and the related descriptions thereof.

In some embodiments, a cascade node (e.g., 730-1, 730-n) of the oscillation circuit may be grounded through a capacitor (e.g., 740-1, 740-n, or the like).

A cascade node may be a connection node arranged between adjacent voltage controlled oscillators for flipped and complementary low noise in the cascade string. For example, when an inductor $L3_A$ of a second resonant cavity of a voltage controlled oscillator A for flipped and complementary low noise at a relatively higher potential is directly connected to an inductor $L1_B$ of a first resonant cavity of a next neighbor voltage controlled oscillator B for flipped and complementary low noise at a relatively lower potential, the cascade node may be a connection point between the inductor $L3_A$ and the inductor $L1_B$.

In some embodiments, the capacitor (e.g., 740-1, 740-n, or the like) may include at least one of a polar capacitor (e.g., an electrolytic capacitor), a motor capacitor, a power compensation capacitor, etc. In some embodiments, a capacitance value of a capacitor that is used to connect the cascade node to the ground may be greater than a capacitance value of the capacitor included in the voltage controlled oscillator for flipped and complementary low noise. For example, the capacitance value of the capacitor that is used to connect the cascade node to the ground may be more than 100 times the capacitance value of the capacitor (e.g., 740-1) included in the voltage controlled oscillator for flipped and complementary low noise, or the capacitance value of the capacitor that is used to connect the cascade node to the ground (e.g., 740-1) may be in microfarads, etc.

In some embodiments, a cascade node of an oscillation circuit may be connected to the ground through a capacitance adjustable component to achieve a filtering effect, which filters out a direct current signal or a low-frequency signal to improve the quality of the output oscillation signal.

In some embodiments, a count of the voltage controlled oscillators for flipped and complementary low noise in the cascade string may not exceed a preset count. In some embodiments, the preset count may be determined based on a voltage of the power supply and a voltage tolerance of a negative resistance device.

A voltage tolerance may be a maximum or minimum voltage that ensures a normal work of a device. The voltage tolerance of the negative resistance device (e.g., a field effect transistor, a triode, or the like) may be determined through a specification sheet, a test, etc.

In some embodiments, the preset count may be a quotient of half the voltage of the power supply and the voltage tolerance. A calculation of the preset count may be represented in the following equation (1):

$$N = \frac{1}{2} * \frac{V_{VCO\_SUPPLY}}{V_{tolerance}} \quad (1)$$

wherein, N refers to a preset count, $V_{VCO\_SUPPLY}$ refers to a voltage of a power supply, and $V_{tolerance}$ refers to a voltage tolerance of a negative resistance device.

In some embodiments, a count of voltage controlled oscillators for flipped and complementary low noise in a cascade string may be restricted to not exceed a preset count, thereby improving the reliability of an oscillation circuit formed by cascading.

In some embodiments, at least two voltage controlled oscillators for flipped and complementary low noise may be cascaded in series, so that an oscillation circuit formed by cascading may have a better noise performance.

The basic concepts have been described above. Obviously, for those skilled in the art, the above-mentioned detailed disclosure is only used as an embodiment, and it does not constitute a limitation of the present disclosure. Although not expressly stated here, those skilled in the art may make various modifications, improvements, and corrections to the present disclosure. Such modifications, improvements, and corrections are suggested in the present disclosure, so such modifications, improvements, and corrections still belong to the spirit and scope of the exemplary embodiments of the present disclosure.

Meanwhile, the present disclosure uses specific words to describe the embodiments of the present disclosure. For example, "one embodiment", "an embodiment", and/or "some embodiments" refer to a certain feature, structure, or characteristic related to at least one embodiment of the present disclosure. Therefore, it should be emphasized and noted that two or more references to "an embodiment" "one embodiment" or "an alternative embodiment" in different places in the present disclosure do not necessarily refer to the same embodiment. In addition, certain features, structures, or characteristics in one or more embodiments of the present disclosure may be properly combined.

In addition, unless explicitly stated in the claims, the order of processing elements and sequences described in the present disclosure, the use of numbers and letters, or the use of other names are not used to limit the sequence of processes and methods in the present disclosure. While the foregoing disclosure has discussed some embodiments of the invention that are presently believed to be useful by way of various examples, it should be understood that such detail is for illustrative purposes only and that the appended claims are not limited to the disclosed embodiments, but rather, the claims are intended to cover all modifications and equivalent combinations that fall within the spirit and scope of the present disclosure. For example, although the implementation of various components described above may be embodied in a hardware device, it may also be implemented as a software only solution, e.g., an installation on an existing server or mobile device.

In the same way, it should be noted that in order to simplify the expression disclosed in the present disclosure and help the understanding of one or more embodiments of the invention, in the foregoing description of the embodiments of the present disclosure, sometimes multiple features are combined into one embodiment, drawings, or descriptions thereof. However, this method of disclosure does not imply that the subject matter of the present disclosure requires more features than are recited in the claims. Rather, claimed subject matter may lie in less than all features of a single foregoing disclosed embodiment.

In some embodiments, numbers describing the quantity of components and attributes are used. It should be understood that such numbers used in the description of the embodiments use the modifiers "about", "approximately" or "substantially" in some examples. Unless otherwise stated, "about", "approximately" or "substantially" indicates that the stated figure allows for a variation of ±20%. Accordingly, in some embodiments, the numerical parameters used in the present disclosure and claims are approximations that can vary depending on the desired characteristics of individual embodiments. In some embodiments, numerical parameters should take into account the specified significant digits and adopt the general digit reservation method. Although the numerical ranges and parameters used in some embodiments of the present disclosure to confirm the breadth of the range are approximations, in specific embodiments, such numerical values should be set as precisely as practicable.

Each patent, patent application, patent application publication, and other material, such as article, book, specification, publication, document, etc., cited in the present disclosure is hereby incorporated by reference in its entirety. Historical application documents that are inconsistent with or conflict with the content of the present disclosure are excluded, and documents (currently or later appended to the present disclosure) that limit the broadest scope of the claims of the present disclosure are excluded. It should be noted that if there is any inconsistency or conflict between the descriptions, definitions, and/or terms used in the accompanying materials of the present disclosure and the contents of the present disclosure, the descriptions, definitions, and/or terms used in the present disclosure shall prevail.

Finally, it should be understood that the embodiments described in the present disclosure are only used to illustrate the principles of the embodiments of the present disclosure. Other modifications are also possible within the scope of the present disclosure. Therefore, by way of example and not limitation, alternative configurations of the embodiments of the present disclosure may be considered consistent with the teachings of the present disclosure. Accordingly, the embodiments of the present disclosure are not limited to the embodiments explicitly introduced and described in the present disclosure.

What is claimed is:

1. A flip-flop complementary low-noise voltage controlled oscillator capable of reducing up-conversion of flicker noise, comprising: a first inductor L1, a second inductor L2, a third inductor L3, a first capacitor array C1, a first capacitance adjustable component C2, a first capacitor C3, a second capacitor C4, a second capacitance adjustable component C5, a second capacitor array C6, a first NMOS transistor M1, a second NMOS transistor M2, a first PMOS transistor M3, a second PMOS transistor M4, and a port OUTP, a port OUTN, wherein the first inductor L1 is connected to the first capacitor array C1 and the first capacitance adjustable component C2 in parallel, the first NMOS transistor M1 and the second NMOS transistor M2 form a NMOS mutual coupling pair, a drain of the first NMOS transistor M1 is connected to a gate of the second NMOS transistor M2 and then connected to the a terminal a of the first inductor L1, a drain of the second NMOS transistor M2 is connected to a gate of the first NMOS transistor M1 and then connected to a terminal b of the first inductor L1;

the third inductor L3 is connected with the second capacitance adjustable component C5 and the second capacitor array C6 in parallel, the first PMOS transistor M3 and the second PMOS transistor M4 form a PMOS mutual coupling pair, a drain of the first PMOS transistor M3 is connected a gate of the second PMOS transistor M4 and then connected to a terminal a of the third inductor L3, and a drain of the second PMOS transistor M4 is connected to a gate of the first PMOS transistor M3 and then connected to a terminal b of the third inductor L3;

sources of the first NMOS transistor M1 and the second NMOS transistor M2are connected together and then connected to a terminal a of the second inductor L2, sources of the first PMOS transistor M3 and the second PMOS transistor M4 are connected together and then connected to a terminal b of the second inductor L2, a terminal a of the first capacitor C3 is connected to the drain of the first NMOS transistor M1, a terminal b of the first capacitor C3 is connected to the drain of first PMOS transistor M3, a terminal a of the second capacitor C4 is connected to the drain of the second NMOS transistor M2, a terminal b of the second capacitor C4 is connected to the drain of the second PMOS transistor M4, a center tap of the first inductor L1 is connected to a power supply, a center tap of the third inductor L3 is connected to ground, and the port OUTP is connected to the drain of the first NMOS transistor M1, the port OUTN is connected to the drain of the second NMOS transistor M2, and differential signals flow from the port OUTP and the port OUTN; wherein the first NMOS transistor M1 and the second NMOS transistor M2 are the same, the first capacitor array C1 and the second capacitor array C6 are the same, the first capacitance adjustable component C2 and the second capacitance adjustable component C5 are the same, the first capacitor C3 and the second capacitor C4 are the same, the first PMOS transistor M3 and the second PMOS transistor M4 are the same.

2. The flip-flop complementary low-noise voltage controlled oscillator of claim 1, wherein the capacitance adjustable component includes a first transistor variable capacitor C1' and a second transistor variable capacitor C2', a first capacitor C3' and a second capacitor C4', a first resistor R1 and a second resistor R2, and four ports VOP, VON, VCTRL, and VIBIAS;

the port VOP is connected to a terminal a of the first capacitor C3', and a terminal b of the first capacitor C3' is connected to a terminal b of the first resistor R1 and a terminal a of the first transistor variable capacitor C1', the port VON is connected to a terminal a of the second capacitor C4', and a terminal b of the second capacitor C4' is connected to a terminal b of the second resistor R2 and a terminal a of the second transistor variable capacitor C2', the port VCTRL is connected to a terminal b of the first transistor variable capacitor C1' and a terminal b of the second transistor variable capacitor C2', and the port VIBIAS is connected to a terminal a of the first resistor R1 and a terminal a of the second resistor R2, the first transistor variable capacitor C1' is the same as the second transistor variable capacitor C2', the first capacitor C3' is the same as the second capacitor C4', and the first resistor R1 is the same as the second resistor R2.

3. A flip-flop complementary low-noise voltage-controlled oscillator circuit generating IQ orthogonal oscillation signals, comprising a pair of flip-flop complementary low-noise voltage-controlled oscillators capable of reducing up-conversion of flicker noise according to claim 1, wherein a coupling relationship forms between inductors of the pair of flip-flop complementary low-noise voltage-controlled oscillators connected to a source terminal of a MOS transistor, henceforth enabling an I-channel and a Q-channel be orthogonal and generating IQ orthogonal differential signals.

4. A flip-flop complementary low-noise voltage-controlled oscillator capable of reducing up-conversion of flicker noise, comprising: a first inductor L1, a second inductor L2, a third inductor L3, a first capacitor array C1, a first capacitance adjustable component C2, a first capacitor C3, a second capacitor C4, a second capacitance adjustable component C5, a second capacitor array C6, a first NMOS transistor M1, a second NMOS transistor M2, a first PMOS transistor M3, a second PMOS transistor M4, and a port OUTP, a port OUTN, wherein the first inductor L1 is connected to the first capacitor array C1 and the first capacitance adjustable component C2 in parallel, the first NMOS transistor M1 and the second NMOS transistor M2 form a NMOS mutual coupling pair, a substrate of the first NMOS transistor M1 is connected to a gate of the first NMOS transistor M1, a substrate of the second NMOS transistor M2 is connected to a gate of the second NMOS transistor M2, a drain of the first NMOS transistor M1 is connected to the gate of the second NMOS transistor M2 and then connected to the a terminal a of the first inductor L1, a drain of the second NMOS transistor M2 is connected to the gate of the first NMOS transistor M1 and then connected to a terminal b of the first inductor L1;

the third inductor L3 is connected to the second capacitance adjustable component C5 and the second capacitor array C6 in parallel, the first PMOS transistor M3 and the second PMOS transistor M4 form a PMOS mutual coupling pair, a substrate of the first PMOS transistor M3 is connected a gate of the first PMOS transistor M3, a substrate of the second PMOS transistor M4 is connected to a gate of the second PMOS transistor M4, a drain of the first PMOS transistor M3 is connected to the gate of the second PMOS transistor M4 and then connected to a terminal a of the third inductor L3, and a drain of the second PMOS transistor M4 is connected to the gate of the first PMOS transistor M3 and then connected to a terminal b of the third inductor L3, sources of the first NMOS transistor M1 and the second NMOS transistor M2 are connected together and then connected to a terminal a of the second inductor L2, sources of the first PMOS transistor M3 and the second PMOS transistor M4 are connected together and then connected to a terminal b of the second inductor L2;

a terminal a of the first capacitor C3 is connected to the drain of the first NMOS transistor M1, a terminal b of the first capacitor C3 is connected to the drain of the first PMOS transistor M3, a terminal a of the second capacitor C4 is connected to the drain of the second NMOS transistor M2, a terminal b of the second capacitor C4 is connected to the drain of the second PMOS transistor M4, a center tap of the first inductor L1 is connected to a power supply, a center tap of the third inductor L3 is connected to ground, and the port OUTP is connected to the drain of the first NMOS transistor M1, the port OUTN is connected to the drain of the second NMOS transistor M2, and differential signals flow from the port OUTP and the port OUTN;

the first NMOS transistor M1 and the second NMOS transistor M2 are the same, the first capacitor array C1 and the second capacitor array C6 are the same, the first capacitance adjustable component C2 and the second capacitance adjustable component C5 are the same, the first capacitor C3 and the second capacitor C4 are the same, the first PMOS transistor M3 and the second PMOS transistor M4 are the same.

5. The flip-flop complementary low-noise voltage-controlled oscillator of claim 4, wherein the capacitance adjustable component includes a first transistor variable capacitor C1' and a second transistor variable capacitor C2', a first capacitor C3' and a second capacitor C4', a first resistor R1 and a second resistor R2, and four ports VOP, VON, VCTRL, and VIBIAS;

the port VOP is connected to a terminal a of the first capacitor C3', and a terminal b of the first capacitor C3' is connected to a terminal b of the first resistor R1 and a terminal a of the first transistor variable capacitor C1', the port VON is connected to a terminal a of the second capacitor C4', and a terminal b of the second capacitor C4' is connected to a terminal b of the second resistor R2 and a terminal a of the second transistor variable capacitor C2', the port VCTRL is connected to a terminal b of the first transistor variable capacitor C1' and a terminal b of the second transistor variable capacitor C2', and the port VIBIAS is connected to a terminal a of the first resistor R1 and a terminal a of the second resistor R2;

the first transistor variable capacitor C1' is the same as the second transistor variable capacitor C2', the first capacitor C3' is the same as the second capacitor C4', and the first resistor R1 is the same as the second resistor R2.

6. A flip-flop complementary low-noise voltage-controlled oscillator circuit generating IQ orthogonal oscillation signals, comprising a pair of flip-flop complementary low-noise voltage-controlled oscillators capable of reducing up-conversion of flicker noise of claim 4, wherein a coupling relationship forms between inductors of the pair of flip-flop complementary low-noise voltage-controlled oscillators connected to a source terminal of a MOS transistor, henceforth enabling an I-channel and a Q-channel be orthogonal and generating the IQ orthogonal differential signals.

* * * * *